US009964597B2

(12) United States Patent
Rangachari et al.

(10) Patent No.: US 9,964,597 B2
(45) Date of Patent: May 8, 2018

(54) SELF TEST FOR SAFETY LOGIC

(71) Applicant: Texas Instruments Incorporated, Dallas, TX (US)

(72) Inventors: Sundarrajan Rangachari, Trichy (IN); Saket Jalan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/255,044

(22) Filed: Sep. 1, 2016

(65) Prior Publication Data
US 2018/0059180 A1    Mar. 1, 2018

(51) Int. Cl.
*G01R 31/319* (2006.01)
*G01R 31/317* (2006.01)
*G01R 31/3177* (2006.01)

(52) U.S. Cl.
CPC ... *G01R 31/31901* (2013.01); *G01R 31/3177* (2013.01); *G01R 31/31703* (2013.01); *G01R 31/31724* (2013.01); *G01R 31/31727* (2013.01)

(58) Field of Classification Search
CPC .............. G01R 31/31901; G01R 31/31703
See application file for complete search history.

(56) References Cited

U.S. PATENT DOCUMENTS

| 3,976,940 | A | * | 8/1976 | Chau ................ G01R 19/16519 714/700 |
| 4,271,515 | A | * | 6/1981 | Axtell, III .......... G01R 31/2834 702/117 |
| 4,635,259 | A | * | 1/1987 | Schinabeck ...... G01R 31/31713 702/120 |
| 4,637,020 | A | * | 1/1987 | Schinabeck ...... G01R 31/31713 702/120 |
| 4,658,400 | A | * | 4/1987 | Brown ............. G01R 31/31935 714/724 |
| 2003/0056134 | A1 | | 3/2003 | Kanapathippillai et al. |
| 2009/0022000 | A1 | * | 1/2009 | Sannomiya ............ G11C 29/32 365/201 |
| 2012/0169361 | A1 | | 7/2012 | Chien et al. |
| 2013/0019130 | A1 | * | 1/2013 | Hakhumyan .......... G06F 11/27 714/718 |
| 2014/0232422 | A1 | | 8/2014 | Sontakke et al. |
| 2015/0143181 | A1 | | 5/2015 | Xiao et al. |

OTHER PUBLICATIONS

International Search Report and Written Opinion in PCT/US 2017/049720, dated Dec. 28, 2017 (7 pages).

* cited by examiner

*Primary Examiner* — Joseph D Torres
(74) *Attorney, Agent, or Firm* — Gregory J. Albin; Charles A. Brill; Frank D. Cimino

(57) ABSTRACT

Methods and apparatus for self test of safety logic in safety critical devices is provided in which the safety logic includes comparator logic coupled to a circuit under test (CUT) in a safety critical device and the self test logic is configured to test the comparator logic. The self test logic may be implemented as a single cycle parallel bit inversion approach, a multi-cycle serial bit inversion approach, or a single cycle test pattern injection approach.

10 Claims, 10 Drawing Sheets

SELF TEST FOR SAFETY LOGIC

BACKGROUND OF THE DISCLOSURE

Field of the Disclosure

Embodiments of the present disclosure generally relate to safety critical devices, and more specifically relate to self test of safety logic in safety critical devices.

Description of the Related Art

Safety critical systems such as automotive radar systems and industrial controls may be implemented as embedded systems. The hardware of such embedded systems, e.g., one or more systems-on-a-chip (SOC) and/or microcontrollers (MCU), and the software are typically required to meet functional safety requirements that include having built-in self test mechanisms, i.e., safety logic, to identify faults in the hardware logic. In addition, test mechanisms are required to identify faults in the safety logic.

SUMMARY

Embodiments of the present disclosure relate to methods and apparatus for self test of safety logic in safety critical devices. In one aspect, an apparatus is provided that includes a circuit under test (CUT) configured to generate a plurality of signal pairs, wherein, for each signal pair, a first signal in the signal pair is expected to be identical to a second signal in the signal pair, safety logic coupled to the CUT to test the CUT, wherein the safety logic comprises a plurality of comparators, each comparator coupled to a respective signal pair and configured to output a first bit value when a first signal bit value of the first signal and a respective second signal bit value of the second signal of the respective signal pair are the same and to output a second bit value when the first and second signal bit values are different, the second bit value indicating a fault in the CUT, and self test logic coupled to the safety logic to test the safety logic, wherein the self test logic is configured to cause at least one comparator of the plurality of comparators to output the second bit value when the self test logic is enabled.

In one aspect, a method for self test of safety logic coupled to a circuit under test (CUT) is provided that includes causing at least one comparator of a plurality of comparators comprised in the safety logic to output a second bit value, wherein each comparator of the plurality of comparators is coupled to a respective signal pair of a plurality of signal pairs generated by the CUT and is configured to output a first bit value when a first signal bit value of a first signal of the respective signal pair and a respective second signal bit value of a second signal of the respective signal pair are the same and to output the second bit value when the first and second signal bit values are different, wherein the causing at least one comparator is performed by self test logic coupled to the safety logic, and combining outputs of the plurality of comparators in a concentrator wherein a bit value output by the concentrator indicates whether or not there is a fault in the safety logic.

BRIEF DESCRIPTION OF THE DRAWINGS

Particular embodiments will now be described, by way of example only, and with reference to the accompanying drawings.

DETAILED DESCRIPTION OF EMBODIMENTS OF THE DISCLOSURE

Figure 1:
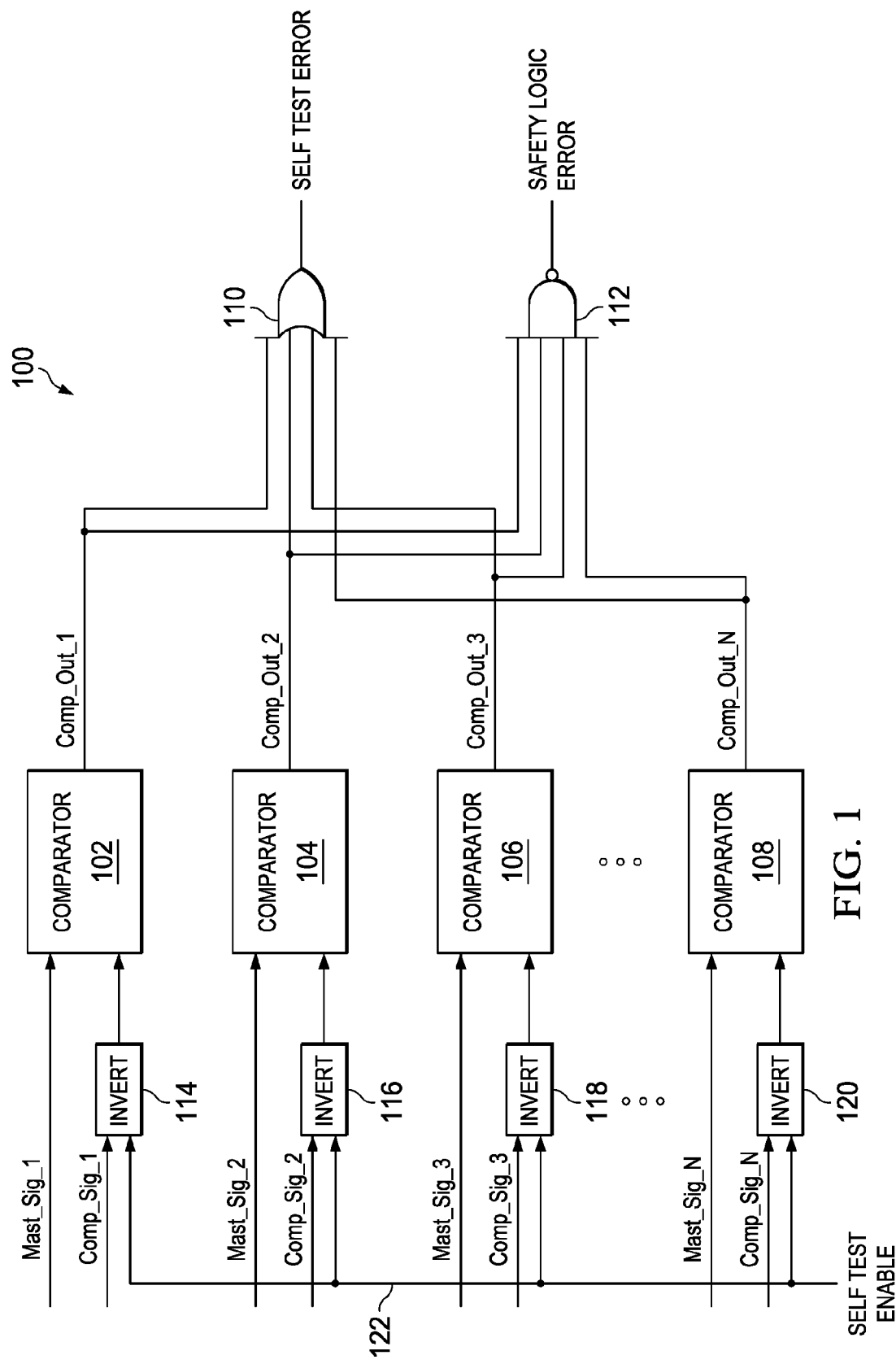
FIG. 1 is a block diagram of example safety logic including an embodiment of single cycle parallel bit inversion self test logic.

Specific embodiments of the disclosure will now be described in detail with reference to the accompanying figures. Like elements in the various figures are denoted by like reference numerals for consistency.

As previously mentioned, embedded safety critical devices such as a system-on-a-chip (SOC) or a microcontroller (MCU) are required to have built-in safety logic to identify faults in the hardware logic and built-in test mechanisms to identify faults in the safety logic itself. Embodiments of the disclosure provide for built-in self test of certain types of safety logic, e.g., lockstep dual module comparator safety logic and parity compare safety logic. In some embodiments, the self test logic is implemented as a single cycle parallel bit inversion approach that covers approximately 75% of the safety logic. In this approach, a fault in the covered safety logic is identified in a single cycle. In some embodiments, the self test logic is implemented as a multi-cycle serial bit inversion approach that covers 100% of the safety logic. In such embodiments, test time increases linearly based on the number of input bits and area overhead is increased to implement the shift register used to implement the serial bit inversion. In some embodiments, the self test logic is implemented as a single cycle test pattern injection approach that covers approximately 75% of the safety logic.

FIG. 1 is a block diagram of example safety logic 100 including an embodiment of single cycle parallel bit inversion self test logic. The safety logic 100 is coupled to a circuit under test (CUT) not specifically shown. The safety logic 100 includes N comparators 102, 104, 106, 108 each having two inputs coupled to receive a respective master signal and a compare signal from the CUT and a single output coupled to a logical OR tree concentrator 110. The number of comparators N depends on the number of signals to be tested for the CUT. Each comparator 102, 104, 106, 108 is configured to compare corresponding bit values of the respective master and compare signals in a single clock cycle and to output a bit value indicating whether or not the master bit and the compare bit are the same. More specifically, each comparator 102, 104, 106, 108 is an exclusive-OR (XOR) gate that outputs a bit value of one when the two input bit values are different and a bit value of zero when the two input bit values are the same. If two input bit values are different, then a fault has occurred in the CUT.

The logical OR tree concentrator 110 combines the multiple output bit values of the comparators 102, 104, 106, 108 into a single bit value output, i.e., a self test error indicator, using a tree of OR gates. In the absence of a fault, the output bit values of the comparators 102, 104, 106, 108 are expected to be zero, and the output bit value of the logical OR tree concentrator 110 is expected to be zero.

The safety logic 100 also includes single cycle parallel bit inversion self test logic for testing the safety logic 100 for faults. The self test logic includes a logical AND tree concentrator 112 and N inverters 114, 116, 118, 120 coupled to a self test enable line 122. Each of the N inverters 114, 116, 118, 120 is coupled between a respective compare signal from the CUT and the compare signal input of a respective comparator 102, 104, 106, 108. The self test enable line 122 is enabled for self test of the safety logic. Each of the inverters 114, 116, 118, 120 is configured to invert the compare bit value when the self test enable line 122 is enabled, i.e., if the compare bit value is zero, the bit value is changed to one, and if the compare bit value is one, the bit value is changed to zero. Further, each of the inverters 114, 116, 118, 120 is configured to pass the compare bit values to the compare signal input of the respective comparator 102, 104, 106, 108 without changing the bit values when the self test enable line 122 is not enabled.

The outputs of the comparators 102, 104, 106, 108 are also coupled to a logical AND tree concentrator 112. The logical AND tree concentrator 112 combines the multiple output bit values of the comparators 102, 104, 106, 108 into a single bit value output, i.e., a safety logic error indicator, using a tree of AND gates. When the self test enable line 122 is activated, the output bit values of the comparators 102, 104, 106, 108 are expected to be one in the absence of a fault in the comparators and the output bit value of the AND tree concentrator 112 is expected to be zero after a final inversion.

Figure 2:
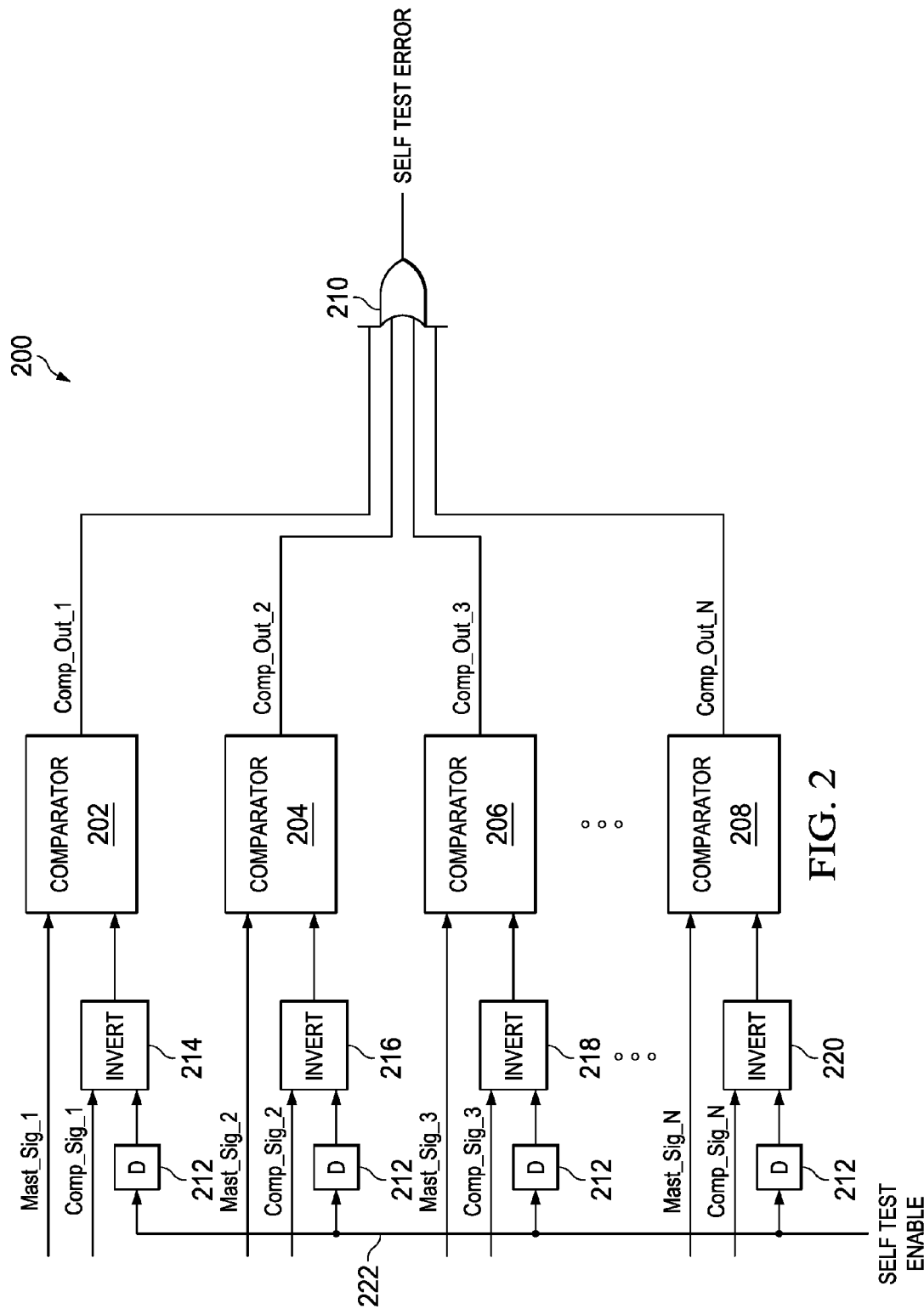
FIG. 2 is a block diagram of example safety logic including an embodiment of multi-cycle serial bit inversion self test logic.

FIG. 2 is a block diagram of example safety logic 200 including an embodiment of multi-cycle serial bit inversion self test logic. The safety logic 200 is coupled to a circuit under test (CUT) not specifically shown. The safety logic 200 includes N comparators 202, 204, 206, 208 each having two inputs coupled to receive a respective master signal and a compare signal from the CUT and a single output coupled to a logical OR tree concentrator 210. The number of comparators N depends on the number of signals to be tested for the CUT. Each comparator 202, 204, 206, 208 is configured to compare corresponding bit values of the respective master and compare signals in a single clock cycle and to output a bit value indicating whether or not the master bit value and the compare bit value are the same. More specifically, each comparator 202, 204, 206, 208 is an exclusive-OR (XOR) gate that outputs a bit value of one when the two input bit values are different and a bit value of zero when the two input bit values are the same. If two input bit values are different, then a fault has occurred in the CUT.

The logical OR tree concentrator 210 combines the multiple output bit values of the comparators 202, 204, 206, 208 into a single bit value output, i.e., a self test error indicator, using a tree of OR gates. In the absence of a fault and when self test of the safety logic is not enabled, the output bit values of the comparators 202, 204, 206, 208 are expected to be 0 and the output bit value of the logical OR tree concentrator 210 is expected to be zero.

The safety logic 200 also includes multi-cycle serial bit inversion self test logic for testing the safety logic 200 for faults. The self test logic includes N inverters 214, 216, 218, 220 coupled to respective bit outputs of a shift register 212 and a self test enable line 222 coupled to the shift register 212. Each of the N inverters 214, 216, 218, 220 is also coupled between a respective compare signal from the CUT and the compare signal input of a respective comparator 202, 204, 206, 208. Each of the inverters 214, 216, 218, 220 is configured to invert the compare bit value when enabled by the shift register 212, i.e., if the compare bit value is zero, the bit value is changed to one and if the compare bit value is one, the bit value is changed to zero. Further, each of the inverters 214, 216, 218, 220 is configured to pass the compare bit values to the compare signal input of the respective comparator 202, 204, 206, 208 without changing the value when the self test enable line 220 is not enabled and the shift register 212 is not activated.

The self test enable line 220 is used to initiate self test of the safety logic which activates the shift register 212. Once activated, the shift register 212 enables each inverter in turn in subsequent clock cycles, i.e., only one compare bit value is inverted in each clock cycle. Because the output of only one comparator is expected to be one in each self test clock cycle, the output of the logical OR tree concentrator 210 is expected to be one during each self test clock cycle. If any of the comparator outputs or the OR tree concentrator 210 output are stuck to zero, then the output bit value of the OR tree concentrator 210 will be zero, indicating a fault in the safely logic.

The self test logic of FIGS. 1 and 2 may be used to test safety logic that includes an OR tree concentrator such as safety logic for lockstep safety critical modules and safety logic for parity comparison in a safety critical module. As is well known, in a lockstep architecture, two identical hardware modules, which may be referred to as a master module and a lockstep or compare module, perform the same operations based on the same inputs and the respective output signals are checked for consistency at each clock cycle. Any disagreement between the respective outputs of the modules is indicative of a fault in one of the modules.

Figure 3:
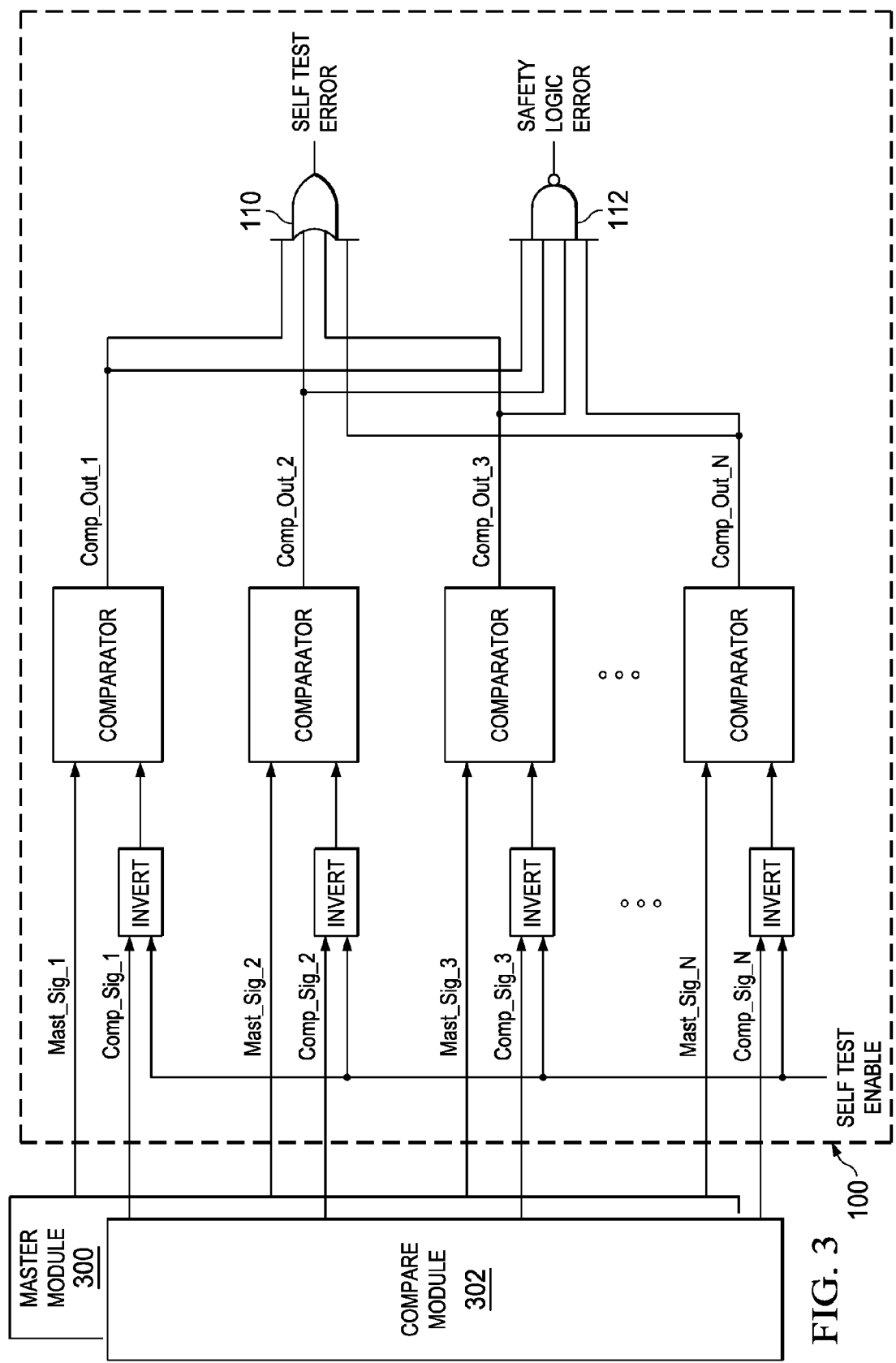
FIG. 3 is a block diagram of lockstep safety critical modules coupled to the safety logic of FIG. 1.
Figure 4:
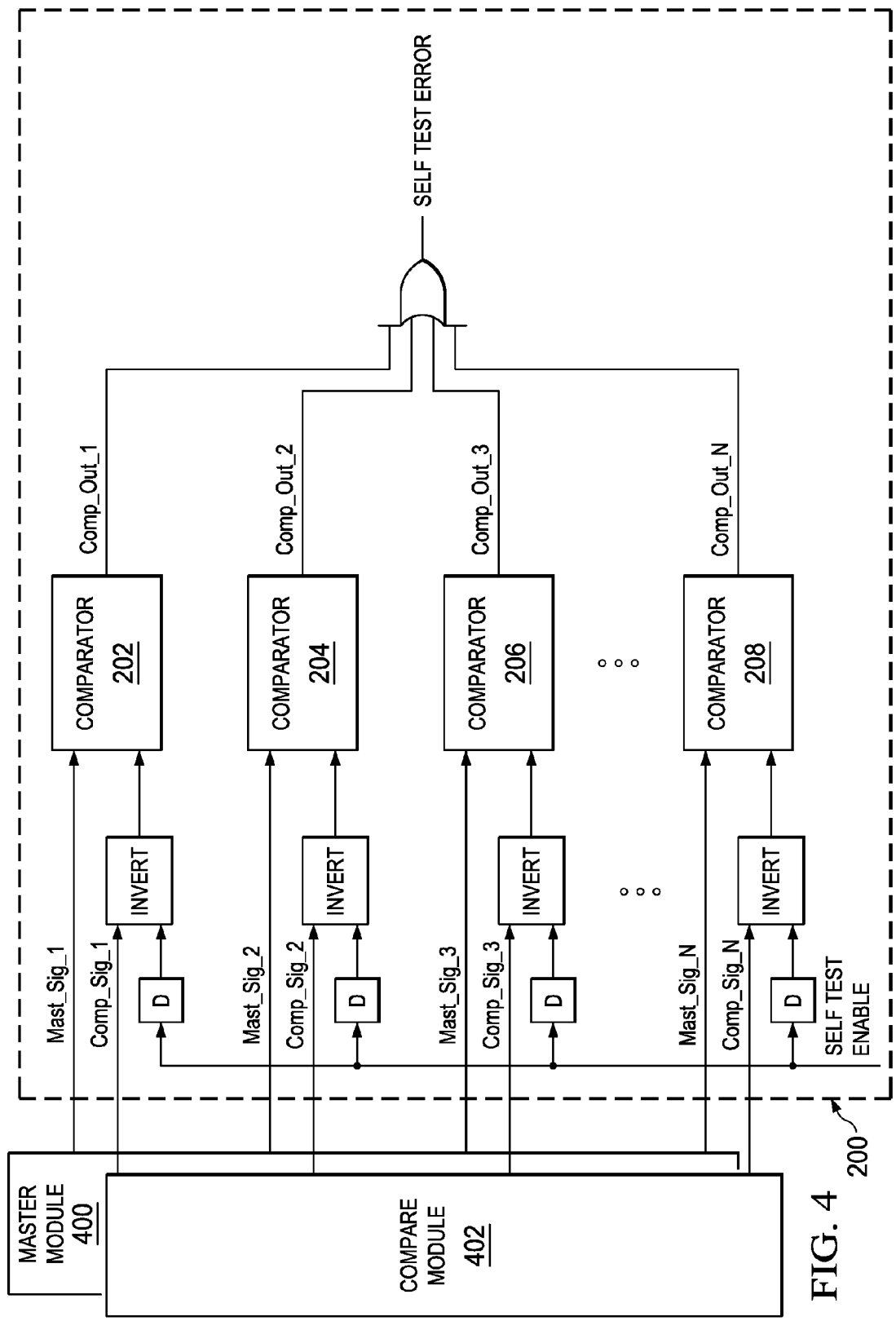
FIG. 4 is a block diagram of lockstep safety critical modules coupled to the safety logic of FIG. 2.

FIG. 3 is a block diagram of lockstep safety critical modules coupled to the safety logic 100 of FIG. 1 and FIG. 4 is a block diagram of lockstep safety critical modules coupled to the safety logic of FIG. 2. As previously explained, the safely logic 100 includes single cycle parallel bit inversion self test logic and the safely logic 200 includes multi-cycle serial bit inversion self test logic. Corresponding output signals of the master module 300 and the compare module 302 are coupled to the safety logic 100 and corresponding output signals of the master module 400 and the compare module 402 are coupled to the safety logic 200. The master and compare modules may be any replicated safety module operating in lockstep, e.g., cores of a dual core processor or replicated modules of a radar system deployed in a safety critical application. Further, the particular signals to be compared between the masters and compare modules may be any signals relevant to overall safety.

Figure 5:
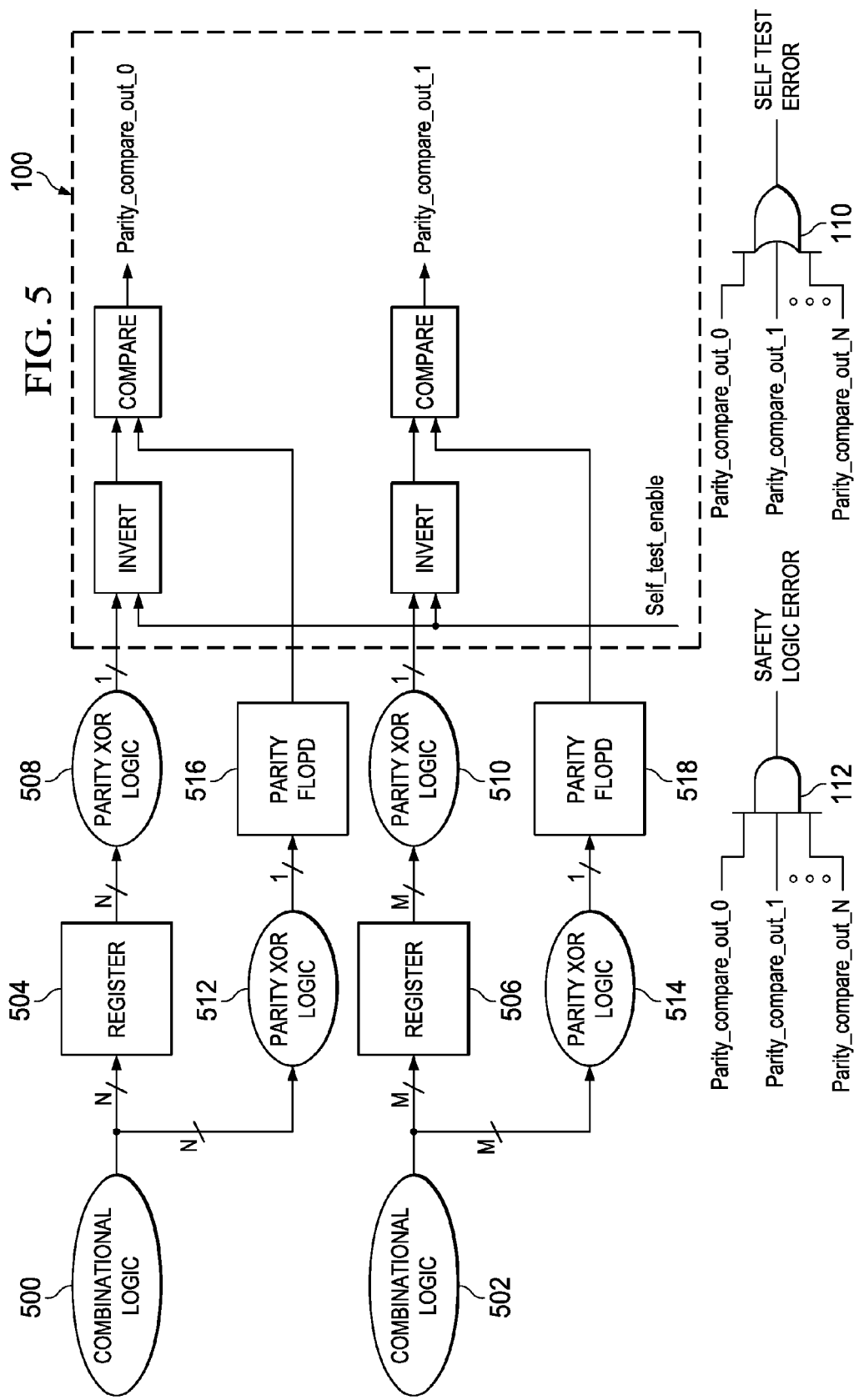
FIG. 5 is a block diagram of parity logic coupled to the safety logic of FIG. 1.

FIG. 5 is a block diagram of parity logic coupled to the safety logic 100 of FIG. 1. For simplicity, FIG. 5 illustrates coupling of the safety logic 100 to outputs of parity logic for two components, combinational logic 500 and combinational logic 502. One of ordinary skill in the art will understand from this example and the foregoing description of FIG. 1 that N components having parity logic may be coupled to the safety logic 100.

Each combinational logic 500, 502 outputs multiple bits and the number of bits output by each may differ. The output of each combinational logic 500, 502 is coupled to a respective register 504, 506 that stores the output bits. Further, the output of each combinational logic 500, 502 is coupled to the input of respective parity XOR logic 512, 514 configured to perform a logical XOR of the output bits to generate a single parity bit. The outputs of the parity XOR logic 512, 514 are coupled to a respective parity data flipflop 516, 518 that stores the single parity bit. Each parity data flipflop 516, 518 is coupled to an input of a respective comparator in the safety logic 100, i.e., each parity data flipflop 516, 518 provides a master signal to a respective comparator in the safety logic 100.

The outputs of the registers 504, 506 are coupled to the input of respective parity XOR logic 508, 510 configured to perform a logic XOR of the bits stored in the respective register 504, 506 to generate a single parity bit. The outputs of the parity XOR logic 512, 514 are coupled to a respective inverter in the safety logic 100, i.e., each parity XOR logic 512, 514 provides a compare bit to a respective inverter in the safety logic 100.

Examples are provided below in the context of a Frequency Modulated Continuous Wave (FMCW) radar system configured for use in automotive safety system applications. One of ordinary skill in the art will understand that embodiments are not limited to an FMCW radar system or to automotive safety system applications. As is well known, an FMCW radar transmits, via one or more transmit antennas, a radio frequency (RF) frequency ramp referred to as a chirp. Further, multiple chirps may be transmitted in a unit referred to as a frame. The transmitted chirps are reflected from any objects in the field of view (FOV) of the radar and are received by one or more receive antennas. The received signal for each receive antenna is down-converted to an intermediate frequency (IF) signal and then digitized. Once the digitized data for an entire frame is received, the data is processed to detect any objects in the FOV and to identify the range, velocity and angle of arrival of detected objects.

Figure 6:
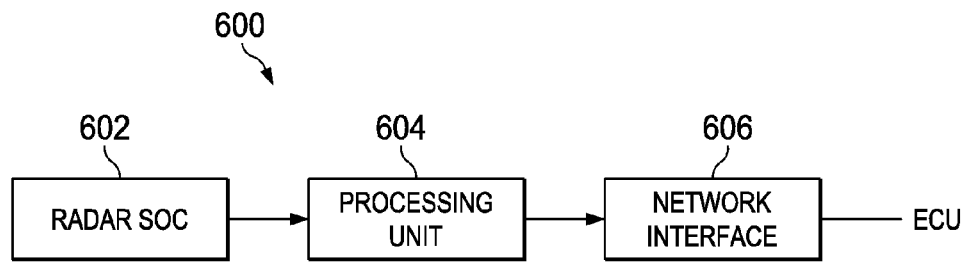
FIG. 6 is a block diagram of an example Frequency Modulated Continuous Wave (FMCW) radar system in which embodiments of the self test logic of FIGS. 1 and 2 may be used.

FIG. 6 is a block diagram of an example Frequency Modulated Continuous Wave (FMCW) radar system 600 in which embodiments of the self test logic of FIGS. 1 and 2 may be used. The example FMCW radar system 600 is configured for use in a vehicle and includes a radar system-on-a-chip (SOC) 602, a processing unit 604, and a network interface 606. An example architecture of the radar SOC 602 is described in reference to FIG. 7.

The radar SOC 602 is coupled to the processing unit 604 via a high speed serial interface. As is explained in more detail in reference to FIG. 7, the radar SOC 602 includes functionality to generate multiple digital intermediate frequency (IF) signals (alternatively referred to as dechirped signals, beat signals, or raw radar signals) that are provided to the processing unit 604 via the high speed serial interface.

The processing unit 604 includes functionality to perform radar signal processing, i.e., to process the received radar signals to determine, for example, distance, velocity, and angle of any detected objects. The processing unit 604 may include any suitable processor or combination of processors as needed for the processing throughput of the application using the radar data. For example, the processing unit 604 may include a digital signal processor (DSP), a microcontroller (MCU), an SOC combining both DSP and MCU processing, or a field programmable gate array (FPGA) and a DSP. In some embodiments, the processing unit 604 may be a dual core processor in which the two cores operate in lockstep for safety purposes. In such embodiments, the dual cores may be coupled to the safety logic of FIG. 1 or FIG. 2, i.e., one core may be a master module 300, 400 and the other core may be a compare module 302, 402. Further, the output signals from the dual cores coupled to the safety logic 100, 200 may be, for example, data, address, and control signals.

The processing unit 604 may provide control information as needed to one or more electronic control units in the vehicle via the network interface 606. Electronic control unit (ECU) is a generic term for any embedded system in a vehicle that controls one or more the electrical system or subsystems in the vehicle. Types of ECU include, for example, electronic/engine control module (ECM), power train control module (PCM), transmission control module (TCM), brake control module (BCM or EBCM), central control module (CCM), central timing module (CTM), general electronic module (GEM), body control module (BCM), and suspension control module (SCM).

The network interface 606 may implement any suitable protocol, such as, for example, the controller area network (CAN) protocol, the FlexRay protocol, or Ethernet protocol.

Figure 7:
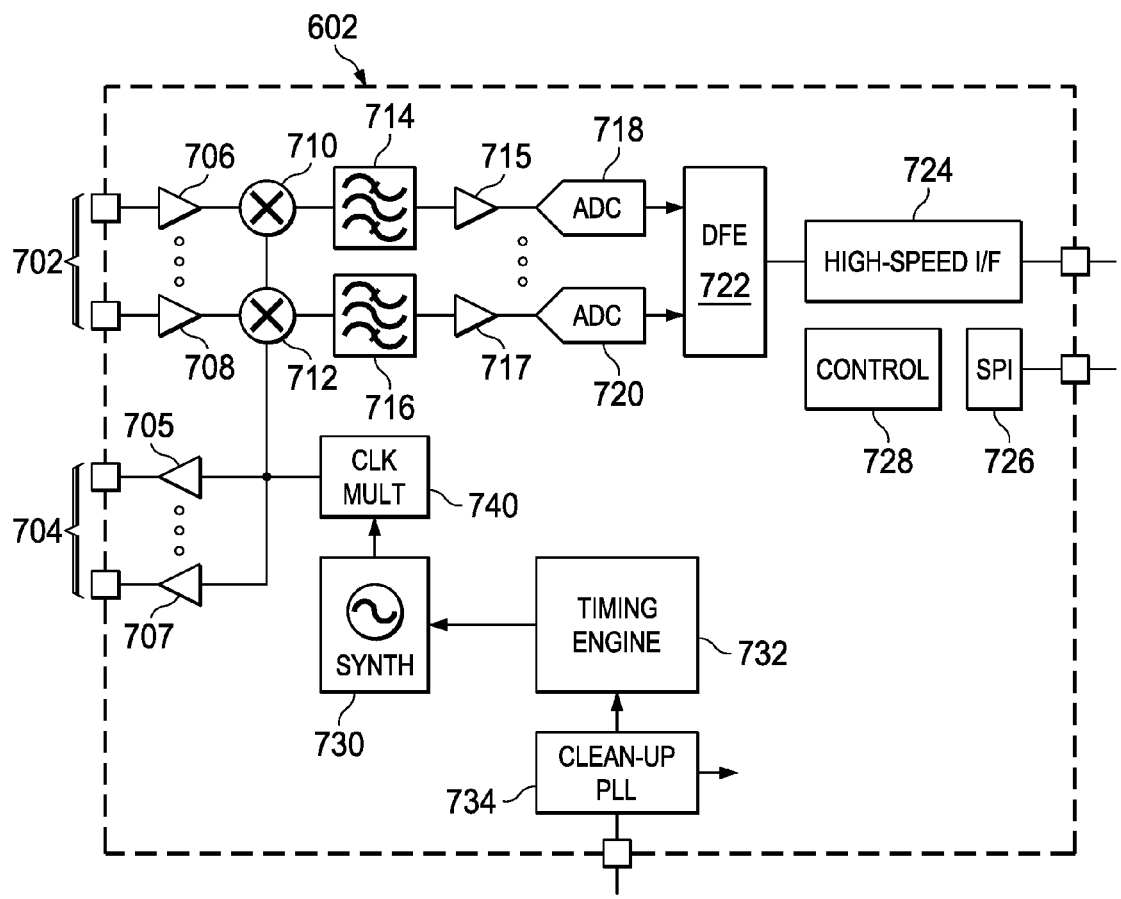
FIG. 7 is a block diagram of an example radar system-on-a-chip (SOC) included in the FMCW radar system of FIG. 6.

FIG. 7 is a block diagram of an example radar SOC 602. The radar SOC 602 may include multiple transmit channels 704 for transmitting FMCW signals and multiple receive channels 702 for receiving the reflected transmitted signals. The transmit channels 704 are identical and include a power amplifier 705, 707 to amplify the transmitted signal and antenna. A receive channel includes a suitable receiver and antenna. Further, each of the receive channels 702 are identical and include a low-noise amplifier (LNA) 706, 708 to amplify the received signal, a mixer 710, 712 to mix the signal generated by transmission generation circuitry in the SOC 602 with the received signal to generate an analog intermediate frequency (IF) signal an intermediate frequency (IF) signal (alternatively referred to as a dechirped signal, beat signal, or raw radar signal), a baseband bandpass filter 714, 716 for filtering the analog IF signal, a variable gain amplifier 715, 717 for amplifying the filtered IF signal, and an analog-to-digital converter (ADC) 718, 720 for converting the analog IF signal to a digital IF signal. The mixer 710, 712 serves as a down converter that generates output signals with a frequency equal to the difference between the frequency of the inputs received from the low-noise amplifier 706, 708 and the transmission generation circuitry, both of which are radio frequency (RF) signals. The bandpass filter, VGA, and ADC of a receive channel may be collectively referred to as a baseband chain or baseband filter chain. Further, the bandpass filter and VGA may be collectively referred to as an IF amplifier.

The receive channels 702 are coupled to the digital front end (DFE) component 722 via the ADCs 718, 720 to provide the digital IF signals to the DFE 722. The DFE 722 includes functionality to perform decimation filtering on the digital IF signals to reduce the data transfer rate. The DFE 722 may also perform other operations on the digital IF signals, e.g., digital compensation of non-idealities in the receive channels, such as inter-RX gain imbalance non-ideality, inter-RX phase imbalance non-ideality and the like. The DFE 722 is coupled to the high speed serial interface (I/F) 724 to transfer decimated digital IF signals to the processing unit 606. As is explained in more detail in reference to FIG. 8, the DFE 722 includes a decimation filter chain and parity logic coupled to safety logic as previously described in reference to FIG. 5 is included to verify safe function of modules in the decimation filter chain.

The serial peripheral interface (SPI) 726 provides an interface for communication with the processing unit 606. For example, the processing unit 606 may use the SPI 726 to send control information, e.g., timing and frequencies of chirps, output power level, triggering of monitoring functions, etc., to the control module 728.

The control module 728 includes functionality to control the operation of the radar SOC 602. The control module 728 may include, for example, a buffer to store output samples of the DFE 722, an FFT (Fast Fourier Transform) engine to compute spectral information of the buffer contents, and an MCU that executes firmware to control the operation of the radar SOC 602.

The programmable timing engine 732 includes functionality to receive chirp parameter values for a sequence of chirps in a radar frame from the control module 728 and to generate chirp control signals that control the transmission and reception of the chirps in a frame based on the parameter values. The chirp parameters are defined by the radar system architecture and may include, for example, a transmitter enable parameter for indicating which transmitters to enable, a chirp frequency start value, a chirp frequency slope, a chirp duration, indicators of when the transmit channels should transmit and when the DFE output digital should be collected for further radar processing, etc. One or more of these parameters may be programmable. The chirp control signals output by the timing engine 732 may include the desired instantaneous frequency (Frequency) for a chirp, a control signal enabling a transmitter (TX Power On), a transmitter polarity control signal (TX Polarity), a control signal indicating that the output of an ADC is valid (ADC Output Valid), frequency synthesizer control signals (SYNTH Control), transmitter control signals (TX Control), software interrupts, etc.

In some embodiments, the timing engine 732 is duplicated for safety purposes and the two timing engines operate in lockstep. In such embodiments, the two timing engines may be coupled to the safety logic of FIG. 1 or FIG. 2, i.e., one timing engine may be a master module 300, 400 and the other timing engine may be a compare module 302, 402. Further, the output signals from the two timing engines coupled to the safety logic 100, 200 may be, for example, the previously described chirp control signals.

The radio frequency synthesizer (SYNTH) 730 includes functionality to generate FMCW signals for transmission based on chirp control signals from the timing engine 732. In some embodiments, the SYNTH 730 includes a phase locked loop (PLL) with a voltage controlled oscillator (VCO).

The clock multiplier 770 increases the frequency of the transmission signal (LO signal) to the LO frequency of the mixers 710, 712. The clean-up PLL (phase locked loop) 734 operates to increase the frequency of the signal of an external low frequency reference clock (not shown) to the frequency of the SYNTH 730 and to filter the reference clock phase noise out of the clock signal.

The clock multiplier 770, synthesizer 730, timing engine 732, and clean up PLL 734 are an example of transmission generation circuitry. The transmission generation circuitry generates a radio frequency (RF) signal as input to the transmit channels and as input to the mixers in the receive channels via the clock multiplier. The output of the transmission generation circuitry may be referred to as the LO (local oscillator) signal or the FMCW signal.

Figure 8:
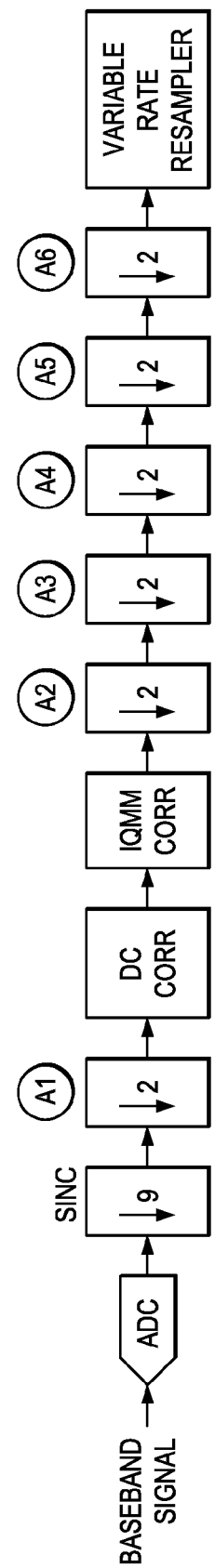
FIG. 8 is a block diagram of an example architecture for the decimation filter chain of the digital frontend of the radar SOC of FIG. 7.

FIG. 8 is a block diagram of an example architecture for the decimation filter chain of the DFE 722 of FIG. 7. As previously mentioned, the DFE 722 performs decimation filtering on digital IF signals received from the ADCs of the receive channels 702. The depicted decimation filter chain includes the following decimation filter modules coupled in series between the ADC and the variable rate resampler: a Sinc filter, a filter A1 configured to decimate the output of the Sinc filter by two, a filter A2 configured to decimate the output of the filter A1 by two, a filter A3 configured to decimate the output of the filter A2 by two, a filter A8 configured to decimate the output of the filter A3 by two, a filter A5 configured to decimate the output of the filter A8 by two, and a filter A6 configured to decimate the output of the filter A5 by two.

The DC correction module is configured to subtract the DC value from the output of the filter A1. The IQ mismatch correction module is configured to correct any imbalance in amplitude and phase between I (in-phase) and Q (quadrature) channels in the output of the DC correction module. The variable rate resampler is configured to modify the sampling rate of the output of the filter A6.

While not specifically shown in FIG. 8, a register is coupled between each of the modules in the chain such that the output of a module is stored in the register on a clock cycle and the next module in the chain is coupled to the register to read from the register on the next clock cycle. There may also be registers for storing internal values. For safety purposes, outputs of each of the modules of the decimation filter chain of the DFE 722 and outputs of the registers may be coupled to parity logic coupled to safety logic as described in reference to FIG. 5. That is, each of the modules of the decimation filter chain may be considered to be combinational logic as shown in FIG. 5.

Figure 9:
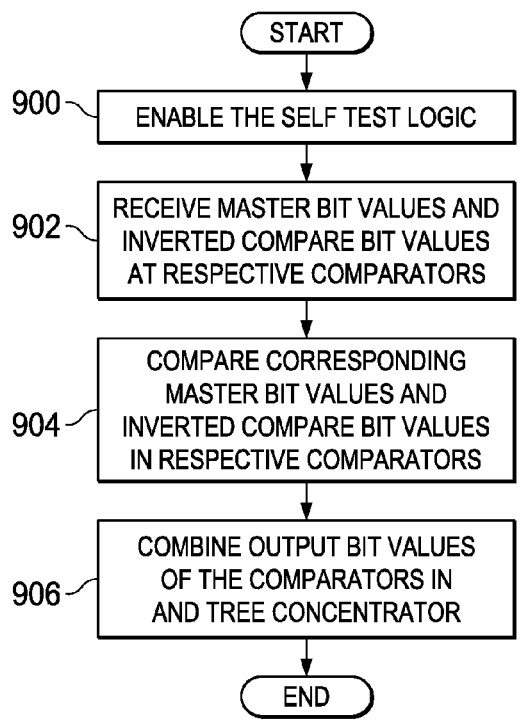
FIGS. 9 and 10 are flow diagrams of methods for self test of safety logic.

FIG. 9 is a flow diagram of a method for self test of safety logic as described in reference to FIG. 1. The method is described in reference to both FIG. 9 and FIG. 1. Initially, the self test logic is enabled 900 via the self test enable line 122. As described in reference to FIG. 1, enabling the self test logic causes the inversion of the compare bit values from the CUT in a single clock cycle. The master bit values from the CUT and the inverted compare bit values are received 902 at the respective comparators 102, 104, 106, 108 in the safety logic in the same clock cycle. The corresponding master bit values and inverted compare bit values are compared 904 in the respective comparators 102, 104, 106, 108 and each comparator outputs an output bit value indicating the result of the comparison in the same clock cycle. The output bit values of the comparators are expected to be one in the absence of a fault in the comparators. The output bit values are combined 906 in the AND tree concentrator 112 in the same clock cycle to generate an output bit value indicative of whether or not there is a fault in the safety logic.

Figure 10:
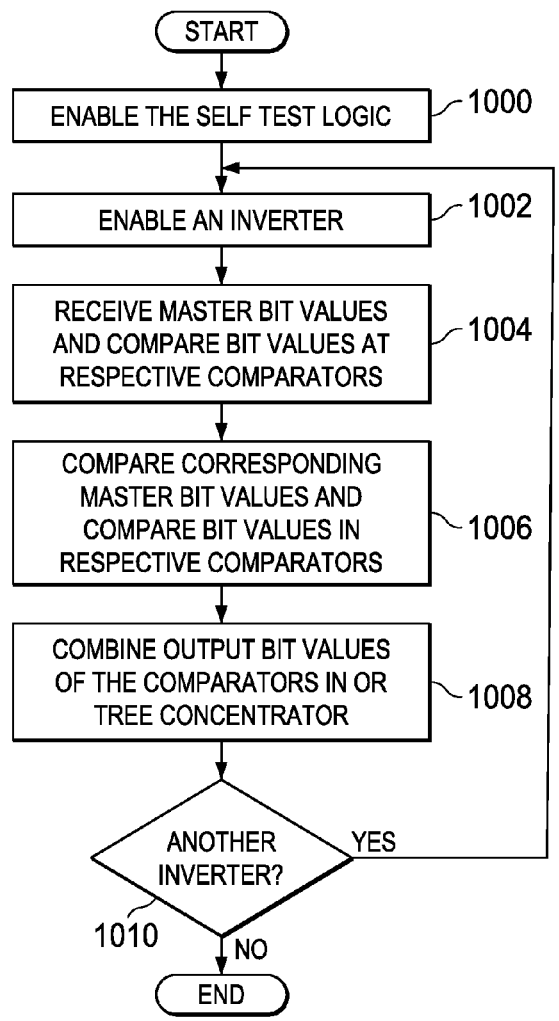

FIG. 10 is a flow diagram of a method for self test of safety logic as described in reference to FIG. 2. The method is described in reference to both FIG. 10 and FIG. 2. Initially, the self test logic is enabled 1000 via the self test enable line 222. As described in reference to FIG. 2, enabling the self test logic activates a shift register that enables each inverter 214, 216, 218, 220 in successive clock cycles. Thus, in one clock cycle, an inverter coupled to a compare signal of a comparator is enabled 1002 to invert the compare bit. The master bit values from the CUT and the compare bit values including the inverted compare bit value are received 1004 at the respective comparators 202, 204, 206, 208 in the safety logic in the same clock cycle. The output bit values are combined 1008 in the OR tree concentrator 210 in the same clock cycle to generate an output bit value indicative of whether or not there is a fault in the safety logic. Steps 1002-1008 are repeated 1010 in subsequent clock cycles until all inverters have been enabled.

Figure 11:
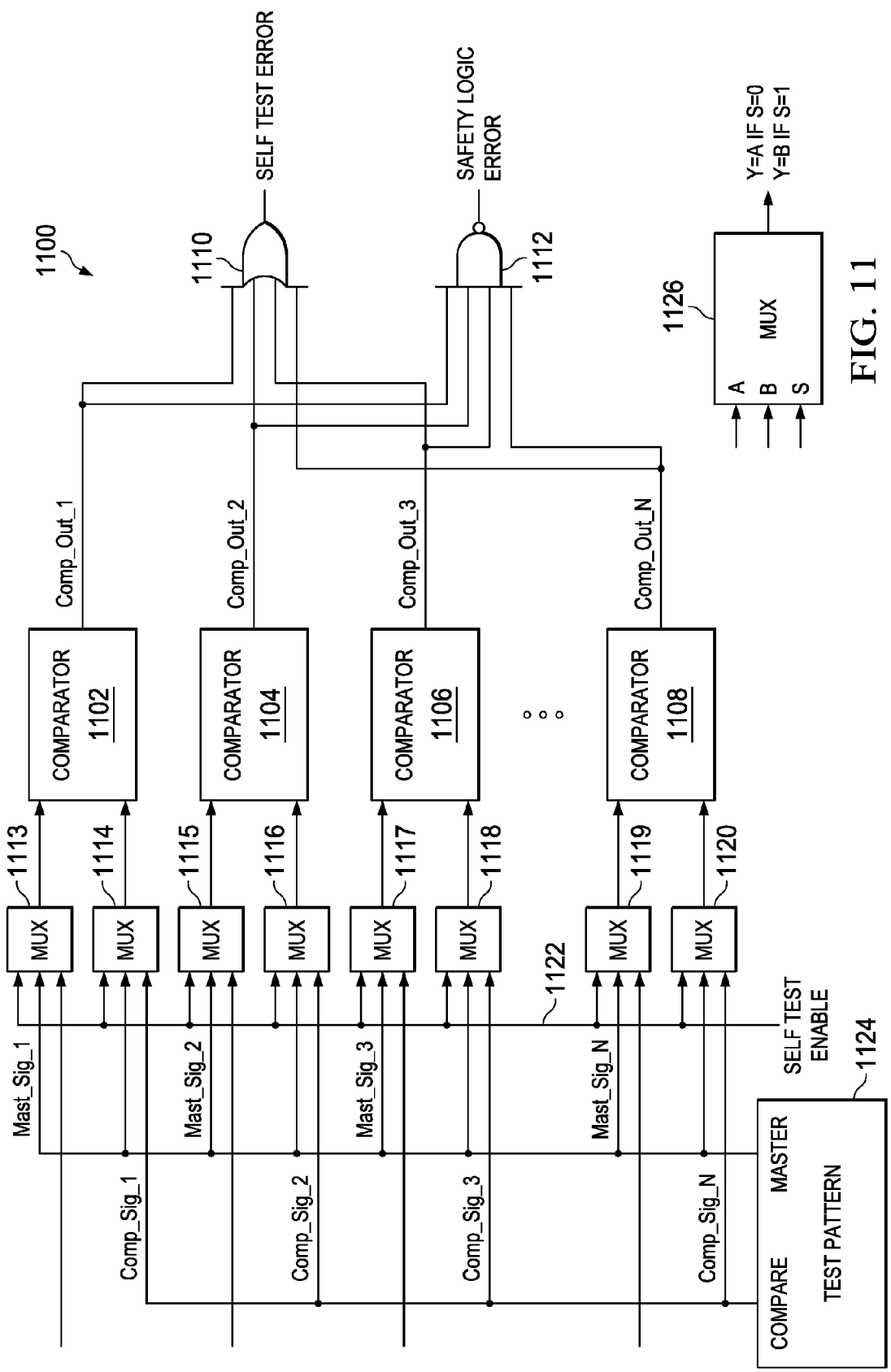
FIG. 11 is a block diagram of example safety logic including self test logic.

FIG. 11 is a block diagram of example safety logic 1100 including an embodiment of single cycle test pattern injection self test logic. The safety logic 1100 is coupled to a circuit under test (CUT) not specifically shown. One of ordinary skill in the art will understand that the CUT may be lockstep safety critical modules or parity logic. The safety logic 1100 includes N comparators 1102, 1104, 1106, 1108 each having two inputs coupled to receive a respective master signal and a compare signal from the CUT and a single output coupled to a logical OR tree concentrator 1110. The number of comparators N depends on the number of signals to be tested for the CUT. Each comparator 1102, 1104, 1106, 1108 is configured to compare corresponding bit values of the respective master and compare signals in a single clock cycle and to output a bit value indicating whether or not the master bit value and the compare bit value are the same. More specifically, each comparator 1102, 1104, 1106, 1108 is an exclusive-OR (XOR) gate that outputs a bit value of one when the two input bits are different and a bit value of zero when the two input bits are the same. If two input bit values are different, then a fault has occurred in the CUT.

The logical OR tree concentrator 1110 combines the multiple output bit values of the comparators 1102, 1104, 1106, 1108 into a single bit value output, i.e., a self test error indicator, using a tree of OR gates. In the absence of a fault, the output bit values of the comparators 1102, 1104, 1106, 1108 are expected to be zero and the output bit value of the logical OR tree concentrator 1110 is expected to be zero.

The safety logic 1100 also includes single cycle test pattern injection self test logic for testing the safety logic 1100 for faults. The self test logic includes a logical AND tree concentrator 1112, N pairs of multiplexers (mux) 1113, 1114, 1115, 1116, 1117, 1118, 1119, 1120 coupled to a self test enable line 1122, and a test pattern generator 1124.

In each mux pair, one mux 1113, 1115, 1117, 1119 is coupled between a respective master signal from the CUT and the master signal input of a respective comparator 1102, 1104, 1106, 1108, and the other mux 1114, 1116, 1118, 1120 is coupled between a respective compare signal from the CUT and the compare signal input of a respective comparator 1102, 1104, 1106, 1108. Further, in each mux pair, an input of one mux 1113, 1115, 1117, 1119 is coupled to a master pattern output of the data pattern generator 1124 and an input of the other mux 1114, 1116, 1118, 1120 is coupled to a compare pattern output of the data pattern generator 1124. The test pattern generator 1124 is configured to generate master and compare test patterns such that each compare test pattern bit provided to each compare mux 1114, 1116, 1118, 1120 is the inverted value of the master test pattern bit provided to each master mux 1113, 1115, 1117, 1119.

As illustrated in the example mux 1126, each mux has three inputs A, B, S and a single output Y coupled to an input of a respective comparator. The input S is coupled to the self test enable line 1122, the input A is coupled to receive a compare signal or a master signal from the CUT, and the input B is coupled to receive compare pattern input or master pattern input from the data pattern generator 1124. Each mux operates such that if Y=A if S=0 (the self test logic is not enabled) and Y=B if S=1 (the self test logic is enabled).

The outputs of the comparators 1102, 1104, 1106, 1108 are also coupled to a logical AND tree concentrator 1112. The logical AND tree concentrator 1112 combines the multiple output bit values of the comparators 1102, 1104, 1106, 1108 into a single bit value output, i.e., a safety logic error indicator, using a tree of AND gates. When the self test enable line 1122 is activated, the outputs of the comparators 1102, 1104, 1106, 1108 are expected to be one in the absence of a fault in the comparators and the output of the AND tree concentrator 1112 is expected to be zero after a final inversion.

Figure 12:
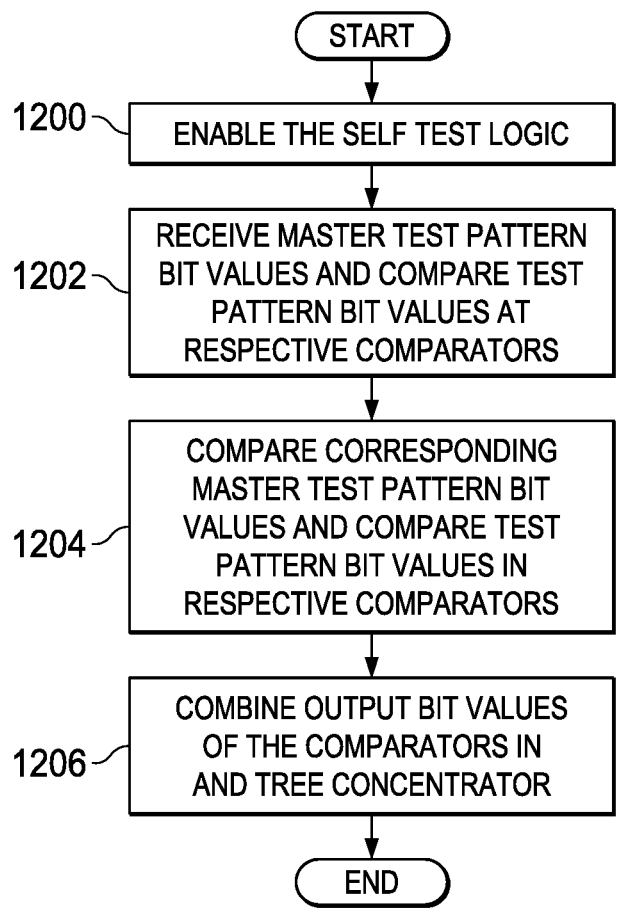
FIG. 12 is a flow diagram of a method for self test of safety logic.

FIG. 12 is a flow diagram of a method for self test of safety logic as described in reference to FIG. 11. The method is described in reference to both FIG. 11 and FIG. 12. Initially, the self test logic is enabled 1200 via the self test enable line 1122. As described in reference to FIG. 11, enabling the self test logic causes master and compare test patterns to be input to the comparators 1102, 1104, 1106, 1108 in a single clock cycle. The master test pattern bit values and the compare test pattern bit values are received 1202 at the respective comparators 1102, 1104, 1106, 1108 in the safety logic in the same clock cycle. The corresponding master test pattern bit values and compare test pattern bit values are compared 1204 in the respective comparators 1102, 1104, 1106, 1108 and each comparator outputs an output bit value indicating the result of the comparison in the same clock cycle. The output bit values of the comparators are expected to be one in the absence of a fault in the comparators. The output bit values are combined 1206 in the AND tree concentrator 1112 in the same clock cycle to generate an output bit value indicative of whether or not there is a fault in the safety logic.

OTHER EMBODIMENTS

While the disclosure has been described with respect to a limited number of embodiments, those skilled in the art, having benefit of this disclosure, will appreciate that other embodiments can be devised which do not depart from the scope of the disclosure as disclosed herein.

For example, some embodiments have been described herein in the context of an embedded radar system in a vehicle. One of ordinary skill in the art will understand embodiments for other applications of embedded radar systems, e.g., surveillance and security applications, maneuvering a robot in a factory or warehouse, industrial fluid sensing, etc. One of ordinary skill in the art will also understand embodiments for systems other than radar systems.

In another example, embodiments have been described herein in which inverters are coupled to receive the compare signals. One of ordinary skill in the art will understand embodiments in which the inverters are coupled to receive the master signals.

In another example, embodiments have been described herein in which logical OR tree concentrators and logical AND tree concentrators are used to combine output bit values of multiple comparators to generate a single bit value indicating whether or not a fault has occurred. One of ordinary skill in the art will understand embodiments in which the concentrators are implemented with functionally equivalent logic, e.g., using NAND gates, NOR gates, etc.

In another example, embodiments have been described herein in which the output bit value of a logical AND tree concentrator is inverted. One of ordinary skill in the art will understand embodiments in which the output bit value is not inverted.

In another example, embodiments have been described herein in which comparators are implemented as XOR gates. One of ordinary skill in the art will understand embodiments in which the comparators are implemented in functionally equivalent logic.

In another example, embodiments have been described herein in which multiplexors are used to select between bit values from master and compare test patterns and bit values from master and compare signals. One of ordinary skill in the art will understand embodiments in which functionally equivalent signal selection logic is used. One of ordinary skill in the art will also understand embodiments in which the test patterns are a single test pattern.

In another example, some embodiments have been described herein in which the processing unit is external to the radar SOC. One of ordinary skill in the art will understand embodiments in which the processing unit is included in the radar SOC.

In another example, embodiments have been described herein in which parity logic is coupled to the safety logic of FIG. 1. One of ordinary skill in the art will understand embodiments in which parity logic is coupled to the safety logic of FIG. 2 or FIG. 3.

In another example, embodiments have been described herein in which lockstep safety critical modules are coupled to the safety logic of FIG. 1 and FIG. 2. One of ordinary skill in the art will understand embodiments in which lockstep safety critical modules are coupled to the safety logic of FIG. 3.

In another example, embodiments have been described herein in reference to an FMCW radar system. One of ordinary skill in the art will understand that embodiments are not limited to FMCW radar systems.

Certain terms are used throughout the description and the claims to refer to particular system components. As one skilled in the art will appreciate, components may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection, for example.

It is therefore contemplated that the appended claims will cover any such modifications of the embodiments as fall within the true scope of the disclosure.

What is claimed is:

1. An apparatus comprising:
   a circuit under test (CUT) configured to generate a plurality of signal pairs, wherein, for each signal pair, a first signal in the signal pair is expected to be identical to a second signal in the signal pair;
   safety logic coupled to the CUT to test the CUT, wherein the safety logic comprises a plurality of comparators, each comparator coupled to a respective signal pair and configured to output a first bit value when a first signal bit value of the first signal and a respective second signal bit value of the second signal of the respective signal pair are the same and to output a second bit value when the first and second signal bit values are different, the second bit value indicating a fault in the CUT; and
   self test logic coupled to the safety logic to test the safety logic, wherein the self test logic is configured to cause at least one comparator of the plurality of comparators to output the second bit value when the self test logic is enabled.

2. The apparatus of claim 1, wherein the self test logic comprises:
   a plurality of inverters, wherein each inverter is coupled between the CUT and a respective comparator of the plurality of comparators to receive one signal of the first signal and the second signal of the signal pair coupled to the respective comparator and is configured to invert a signal bit value of the one signal when enabled to cause the respective comparator to output the second bit value.

3. The apparatus of claim 2, wherein
   the safety logic comprises a concentrator coupled to outputs of the plurality of comparators, wherein the concentrator is configured to combine output bit values of the plurality of comparators such that the first bit value is output by the concentrator when the output bit values are all the first bit value and the second bit value is output when at least one of the output bit values is the second bit value; and
   the self test logic comprises a shift register coupled to the plurality of inverters, the shift register configured to enable each inverter in turn when the self test logic is enabled, wherein one inverter is enabled in a clock cycle to cause the comparator coupled to the one inverter to output the second bit value,
   wherein output of the first bit value by the concentrator is indicative of a fault in the safety logic.

4. The apparatus of claim 2, wherein the self test logic comprises:
   a self test enable line coupled to the plurality of inverters, the self test enable line configured to enable all of the inverters in a single clock cycle; and
   a concentrator coupled to outputs of the plurality of comparators, wherein the concentrator is configured to combine output bit values of the plurality of comparators such that the first bit value is output by the concentrator when the output bit values are all the second bit value and the second bit value is output when at least one of the output bit values is the first bit value,
   wherein output of the second bit value by the concentrator is indicative of a fault in the safety logic.

5. The apparatus of claim 4, wherein the output of the concentrator is inverted.

6. The apparatus of claim 1, wherein the self test logic comprises:
   a test pattern generator configured to generate a test pattern, the test pattern comprising a pair of input bit values for each comparator, wherein for each pair of input bit values, one input bit value is the first bit value and the other input bit value is the second bit value;
   signal selection logic coupled between the CUT and the plurality of comparators to receive the signal pairs and coupled to the test pattern generator to receive the test pattern, the signal selection circuitry configured to send each signal pair to the respective comparator when the self test logic is not enabled, and to send a respective pair of input bit values of the test pattern to each comparator of the plurality of comparators when the self test logic is enabled; and a concentrator coupled to outputs of the plurality of comparators, wherein the concentrator is configured to combine output bit values of the plurality of comparators such that the first bit value is output by the concentrator when the output bit values are all the second bit value and the second bit value is output when at least one of the output bit values is the first bit value, wherein output of the second bit value by the concentrator is indicative of a fault in the safety logic.

7. The apparatus of claim 1, wherein the CUT comprises dual lockstep safety critical modules.

8. The apparatus of claim 7, wherein the dual lockstep safety critical modules are replicated timing engines in a radar system.

9. The apparatus of claim 1, wherein the CUT comprises a plurality of combinational logic, wherein parity logic coupled to each combinational logic generates a respective signal pair of the plurality of signal pairs.

10. The apparatus of claim 9, wherein the plurality of combinational logic is comprised in a decimation filter chain of a radar system.

\* \* \* \* \*